US010586733B2

(12) United States Patent
Conti et al.

(10) Patent No.: US 10,586,733 B2
(45) Date of Patent: *Mar. 10, 2020

(54) MULTI-LEVEL AIR GAP FORMATION IN DUAL-DAMASCENE STRUCTURE

(71) Applicant: International Business Machines Corporation, Armonk, NY (US)

(72) Inventors: Richard A. Conti, Altamont, NY (US); Jessica Dechene, Watervliet, NY (US); Susan S. Fan, Cohoes, NY (US); Son V. Nguyen, Schenectady, NY (US); Jeffrey C. Shearer, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/237,886

(22) Filed: Jan. 2, 2019

(65) Prior Publication Data
US 2019/0157140 A1    May 23, 2019

Related U.S. Application Data

(60) Continuation of application No. 15/690,861, filed on Aug. 30, 2017, now Pat. No. 10,224,239, which is a
(Continued)

(51) Int. Cl.
*H01L 21/768* (2006.01)
*H01L 27/088* (2006.01)
(Continued)

(52) U.S. Cl.
CPC .... *H01L 21/76843* (2013.01); *H01L 21/7682* (2013.01); *H01L 21/76807* (2013.01); *H01L 21/76808* (2013.01); *H01L 21/76877* (2013.01); *H01L 23/5222* (2013.01); *H01L 23/53295* (2013.01); *H01L 27/088* (2013.01)

(58) Field of Classification Search
CPC .......... H01L 21/76843; H01L 23/5222; H01L 27/088; H01L 21/76808; H01L 23/53295; H01L 21/7682
See application file for complete search history.

(56) References Cited

U.S. PATENT DOCUMENTS 5,949,143 A    9/1999  Bang
6,835,631 B1  12/2004  Zhen et al.
(Continued)

OTHER PUBLICATIONS

DiCK James, "Chipworks Real Chips," http://chipworksrealchips.blogspot.com/, Jan. 14, 2016, 6 pages.
(Continued)

*Primary Examiner* — Anthony Ho
(74) *Attorney, Agent, or Firm* — Vazken Alexanian; Ryan, Mason & Lewis, LLP

(57) ABSTRACT

An upper layer is formed in a first interlayer dielectric (ILD) layer. The upper layer comprises a plurality of metal interconnects and one or more upper layer air gaps positioned between adjacent metal interconnects. A lower layer is formed in the first ILD layer. The lower layer comprises one or more vias, and one or more lower air gaps positioned between adjacent vias. The upper layer and the lower layer are formed in accordance with a dual-damascene process.

20 Claims, 9 Drawing Sheets

Related U.S. Application Data division of application No. 15/208,021, filed on Jul. 12, 2016, now Pat. No. 9,859,212.

(51) Int. Cl.
*H01L 23/522* (2006.01)
*H01L 23/532* (2006.01)

(56) References Cited

U.S. PATENT DOCUMENTS

| | | |
|---|---|---|
| 7,094,669 B2 | 8/2006 | Bu et al. |
| 7,358,148 B2 | 4/2008 | Geffken et al. |
| 7,396,757 B2 | 7/2008 | Yang |
| 7,449,407 B2 | 11/2008 | Lur et al. |
| 7,993,816 B2 | 8/2011 | Black et al. |
| 8,420,528 B2 | 4/2013 | Noguchi |
| 8,659,115 B2 | 2/2014 | Lin |
| 8,872,304 B2 | 10/2014 | Oshida |
| 9,054,160 B2 | 6/2015 | Bruce et al. |
| 9,349,687 B1 | 5/2016 | Gates et al. |
| 10,224,239 B2 * | 3/2019 | Conti .................. H01L 21/7682 |
| 2004/0232552 A1 | 11/2004 | Wang et al. |
| 2009/0093100 A1 | 4/2009 | Xia et al. |
| 2016/0013133 A1 | 1/2016 | Gu et al. |
| 2016/0027686 A1 | 1/2016 | Nitta et al. |
| 2016/0172231 A1 | 6/2016 | Lee et al. |

OTHER PUBLICATIONS

Sam Naffziger, "Viewpoint: What Lies Ahead for On-Chip Interconnect Technology?," http://www.monolithic3d.com/blog/what-lies-ahead-for-on-chip-interconnect-technology, Aug. 28, 2011, 4 pages.

P.A. Kohl et al., "Air-Gaps for Electrical Interconnections," Electrochemical and Solid-State Letters, Jan. 1998, pp. 49-51, vol. 1, No. 1.

S.-Y. Kim et al., "Study of Via-Typed Air-Gap for Logic Devices Applications Below 45 nm Node," Transactions on Electrical and Electronic Materials, Aug. 25, 2011, pp. 131-134, vol. 12, No. 4.

S. Park et al., "Air-Gaps for High-Performance On-Chip Interconnect Part II: Modeling, Fabrication, and Characterization," Journal of Electronic Materials, Jun. 2008, pp. 1534-1546, vol. 37, No. 10.

List of IBM Patents or Patent Applications Treated as Related.

* cited by examiner

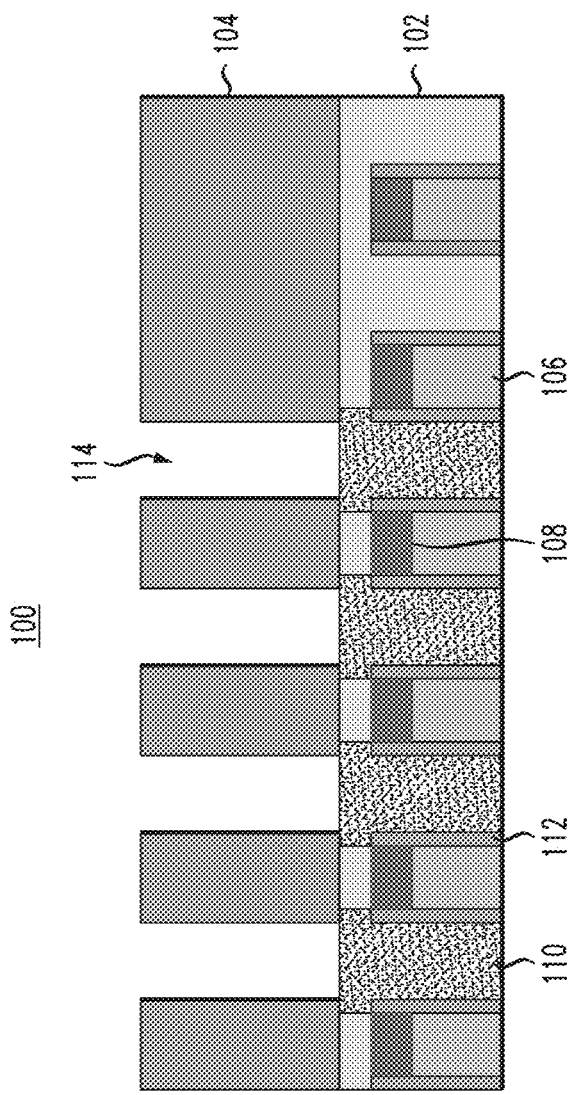

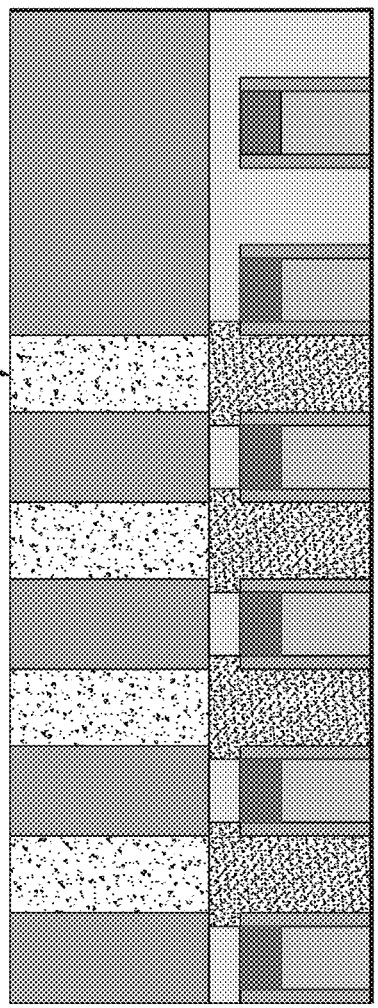

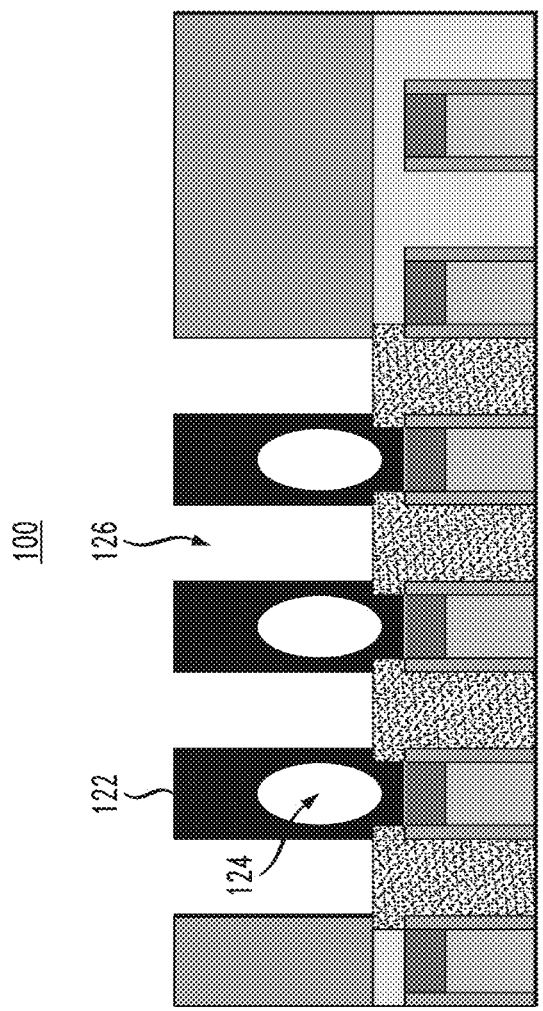

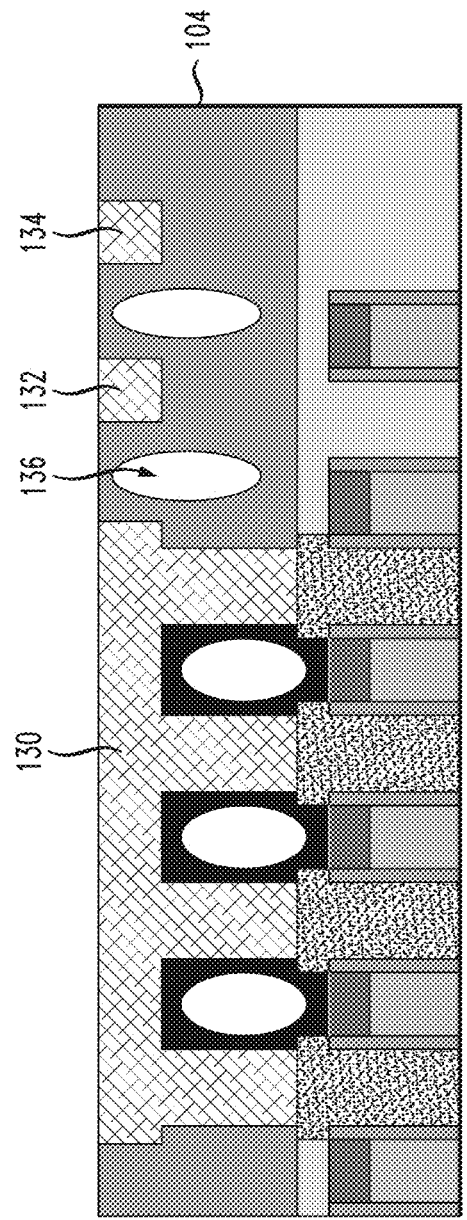

MULTI-LEVEL AIR GAP FORMATION IN DUAL-DAMASCENE STRUCTURE

BACKGROUND

Integrated circuits (ICs or chips) are manufactured or fabricated in a series of stages, including a front-end-of-line (FEOL) stage, middle-of-line (MOL) stage and back-end-of-line (BEOL) stage. The FEOL, MOL and BEOL stages constitute the process flow for fabricating modern chips. Generally, FEOL stage processes include wafer preparation, isolation, well formation, gate patterning, spacer, extension and source/drain implantation, silicide formation and liner formation. The FEOL stage is where elements (e.g., transistors, capacitors, resistors, etc.) are patterned in the semiconductor. The MOL stage is responsible for gate contact (CA) formation. For example, metal interconnects may be deposited during the MOL stage to connect the elements patterned during the FEOL portion.

Metal interconnects (conductors) are typically formed from aluminum (Al), copper (Cu), cobalt (Co), tungsten (W) or ruthenium (Ru). Additive patterning processes have been developed in order to from the metal interconnects during IC fabrication. One such additive patterning process is generally referred to as a damascene process. In a damascene process, the underlying insulating layer (e.g., silicon oxide layer) is patterned with open trenches where the conductor will be formed. A thick coating of metal is deposited to overfill the trenches, and a subsequent process (e.g., chemical-mechanical planarization or CMP) is used to remove the excess metal extending over the top of the insulating layer. In a single-damascene process, a single trench is formed and filled with metal per each damascene stage. However, a dual-damascene process may be used to form and fill a trench and an underlying via at the same time (i.e., in the same damascene stage). Accordingly, the metal remaining after performing the damascene process becomes the patterned conductor.

One or more air gaps may be formed within an insulating (or dielectric) layer of the IC during the fabrication process to reduce capacitive coupling between adjacent interconnects, and to reduce capacitive loading that may affect signal propagation delays.

SUMMARY

Embodiments provide multi-level air gap formation techniques for an improved dual-damascene process and semiconductor structure.

In one embodiment, an upper layer is formed in a first interlayer dielectric (ILD) layer. The upper layer comprises a plurality of metal interconnects and one or more upper layer air gaps positioned between adjacent metal interconnects. A lower layer is formed in the first ILD layer. The lower layer comprises one or more vias, and one or more lower layer air gaps positioned between adjacent vias.

By way of example, the one or more lower layer air gaps may be formed within one or more respective dielectric regions. Furthermore, the one or more dielectric regions may be comprised of a low-k dielectric material.

Other embodiments include without limitation methods, apparatus, systems, semiconductor devices, and integrated circuits.

These and other exemplary embodiments of the invention will be described in or become apparent from the following detailed description of exemplary embodiments, which is to be read in connection with the accompanying drawings.

BRIEF DESCRIPTION OF THE DRAWINGS

FIG. 1A is a schematic cross-sectional side view a portion of a semiconductor structure at a first-intermediate dual-damascene interconnect fabrication stage, according to an embodiment of the invention.

FIG. 1B is a schematic cross-sectional side view a portion of a semiconductor structure at a second-intermediate dual-damascene interconnect fabrication stage, according to an embodiment of the invention.

FIG. 1F is a schematic cross-sectional side view a portion of a semiconductor structure at a sixth-intermediate dual-damascene interconnect fabrication stage, according to an embodiment of the invention.

FIG. 1I is a schematic cross-sectional side view a portion of a semiconductor structure at a ninth-intermediate dual-damascene interconnect fabrication stage, according to an embodiment of the invention.

DETAILED DESCRIPTION

Figure 1C:
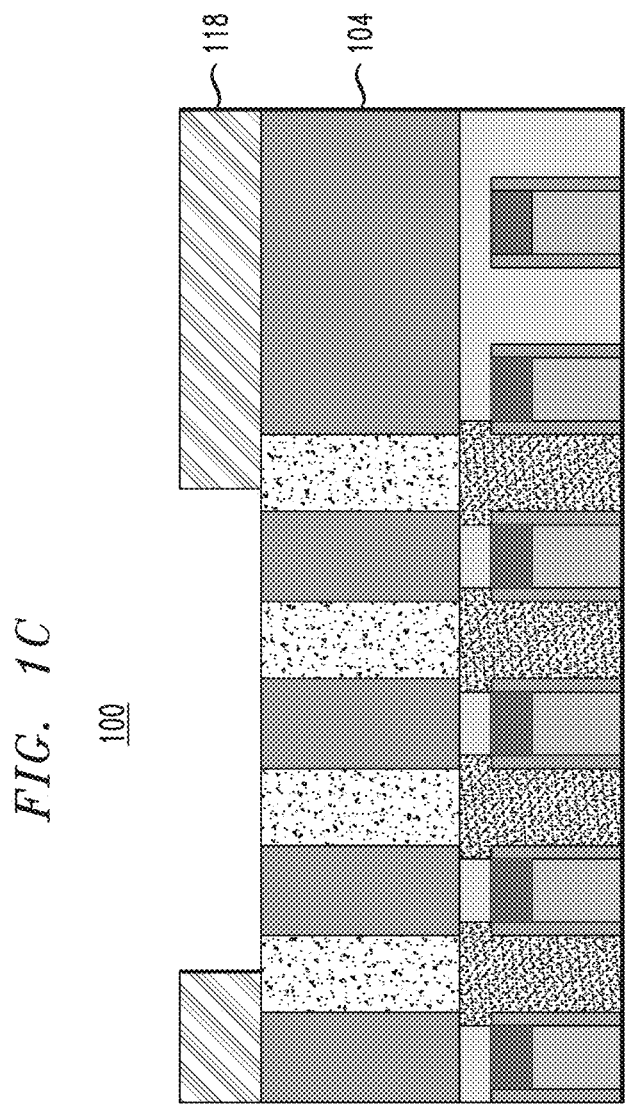
FIG. 1C is a schematic cross-sectional side view a portion of a semiconductor structure at a third-intermediate dual-damascene interconnect fabrication stage, according to an embodiment of the invention.

In illustrative embodiments, techniques are provided for dual-damascene interconnect fabrication in a semiconductor structure. More particularly, illustrative embodiments provide techniques for forming air gaps in both upper and lower levels (multi-level) of a semiconductor structure during the same dual-damascene process. Among other advantages, such air gaps reduce capacitive coupling between adjacent interconnects in the semiconductor structure, and reduce capacitive loading that may affect signal propagation delays in the semiconductor structure.

Furthermore, it is to be understood that embodiments discussed herein are not limited to the particular materials, features, and processing steps shown and described herein. In particular, with respect to formation (fabricating or processing) steps, it is to be emphasized that the descriptions provided herein are not intended to encompass all of the steps that may be used to form a functional integrated circuit device. Rather, certain steps that are commonly used in forming such devices are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about," "approximately" or "substantially" as used herein with regard to thicknesses, widths, percentages, ranges, etc., are meant to denote being close or approximate to, but not exactly. For example, the term "about" or "substantially" as used herein implies that a margin of error is present. The margin of error depends on the application-specific metric that is being described. In one example, 1% or less may represent a reasonable margin of error. However, in another case, 5-15% could be an appropriate margin of error. The main point is that it depends on the metric and the specific application of the metric. Also, in the figures, the illustrated scale of one layer, structure, and/or region relative to another layer, structure, and/or region is not necessarily intended to represent actual scale.

An exemplary process for forming air gaps within a dielectric layer is described in U.S. Pat. No. 9,349,697, entitled "Advanced Manganese/Manganese Nitride Cap/Etch Mask for Air Gap Formation Scheme in Nanocopper Low-K Interconnect," which is commonly owned and incorporated by reference herein. Prior art attempts at air gap formation have been limited to forming air gaps in a single-damascene level, for example, at a metal-1 level, but not capable of forming them also at a via-1 or metal-2 level. Additionally, prior art attempts at air gap formation have formed air gaps in an upper level of semiconductor structure formed using a dual-damascene process, for example, at the metal-2 level, but are not capable of forming them also at the via-1 level.

Embodiments of the invention provide improved air gap formation techniques by enabling the formation of air gaps in both the upper and lower levels of a semiconductor structure formed using a dual-damascene process (also referred to herein as a "dual-damascene structure"). Specifically, illustrative embodiments enable air gaps to be incorporated in both the via portion of the dual-damascene structure and the upper metal interconnect portion during middle-of-line (MOL) processing.

With reference to FIG. 1A, structure 100 is provided to illustrate exemplary contact patterning at a via level of a dual-damascene process. Structure 100 may be referred to as a dual-damascene structure. Note that the same reference numeral (100) is used to denote the dual-damascene structure through the various intermediate fabrication stages illustrated in FIGS. 1A through 1I. Note also that semiconductor structure 100 can also be considered to be a semiconductor device and/or an integrated circuit, or some part thereof.

As shown, structure 100 includes an interlayer dielectric (ILD) layer 102. In one embodiment, ILD layer 102 is comprised of a "low-k" dielectric material. For example, a low-k dielectric material is a material that has a dielectric constant that is about 3.9 or less. Examples of low-k dielectric materials include, but are not limited to, dense or porous organosilicates, silsequioxanes, undoped silicate glass (USG), fluorosilicate glass (FSG), borophosphosilicate glass (BPSG), hydrogenated oxidized silicon carbon (SiCOH), and compounds such as SiCNO and SiNO. ILD layer 102 may be formed by, for example, chemical vapor deposition (CVD), thermal and plasma assisted atomic layer deposition (ALD), plasma enhanced chemical vapor deposition (PECVD) or spin coating. In one embodiment, one or more transistor devices are formed in MD layer 102 during a front end of line (FEOL) process.

Within ILD layer 102, caps 108 are formed over gate regions 106, source/drain contact regions 110, and barrier lines 112. Barrier lines 112 function to isolate gate regions 106 from source/drain contact regions 110. Source/drain contact regions 110 may be formed, for example, by utilizing a plug, after which the surface of ILD layer 102 is planarized. In one embodiment, the plug is a tungsten plug, and the surface of ILD layer 102 is planarized utilizing tungsten chemical mechanical polishing (WCMP). It is to be understood that the number of gate regions, caps, source/drain contact regions, and barrier lines shown in the figures is purely exemplary, and should not be considered limiting.

Following the planarization process, a second dielectric layer, i.e., ILD layer 104, is deposited. In one embodiment, ILD layer 104 is comprised of a low-k dielectric material (which can be the same or similar material as illustratively described above for ILD layer 102). As shown in FIG. 1A, via portions including via portion 114 in ILD layer 104 are defined at the via level of the dual-damascene structure. Accordingly, FIG. 1A illustrates a structure at a step in the formation of the semiconductor structure after completion of the patterning of the source/drain contacts.

With reference to FIG. 1B, an exemplary step of filling of the patterned contacts of structure 100 with sacrificial material is shown. As shown, sacrificial material 116 is deposited into the via portions 114 of the structure. The sacrificial material 116 functions as a placeholder to maintain structural integrity during further processing. In one embodiment, sacrificial material 116 is an organic material, e.g., an organic planarizing layer (OPL) or amorphous carbon (amorphous-C). In another embodiment, sacrificial material 116 is an inorganic material. For example, sacrificial material 116 may be a metal such as cobalt (Co) or aluminum (Al).

With reference to FIG. 1C, an exemplary step of defining of an air gap region within structure 100 is shown. As shown, structure 100 includes etch mask 118 deposited along the top of ILD layer 104. The deposition of etch mask 118 defines an etching region. Etch mask 118 is comprised of a material that provides resistance to an etching processes for removing material, e.g., wet etching, dry (plasma) etching, etc. The particular etching process and etchant used is based on the material being etched away, as is known in the art. Thus, etch mask 118 is selected to protect select regions of structure 100 from the particular etchant being implemented in the etching process.

In one embodiment, etch mask 118 is comprised of a "soft" mask material, such as a resist (e.g., photoresist). In another embodiment, etch mask 118 is comprised of a "hard" mask material. A hard mask material provides etch resistance to plasma etchants, such as oxygen rich plasma or halogen rich plasma. Hard mask materials may be categorized into organic and inorganic types. Various types of etch mask materials, as well as processes for depositing an etch mask in accordance with the embodiments described herein, are known in the art and further discussion thereof will not be provided herein.

Figure 1D:
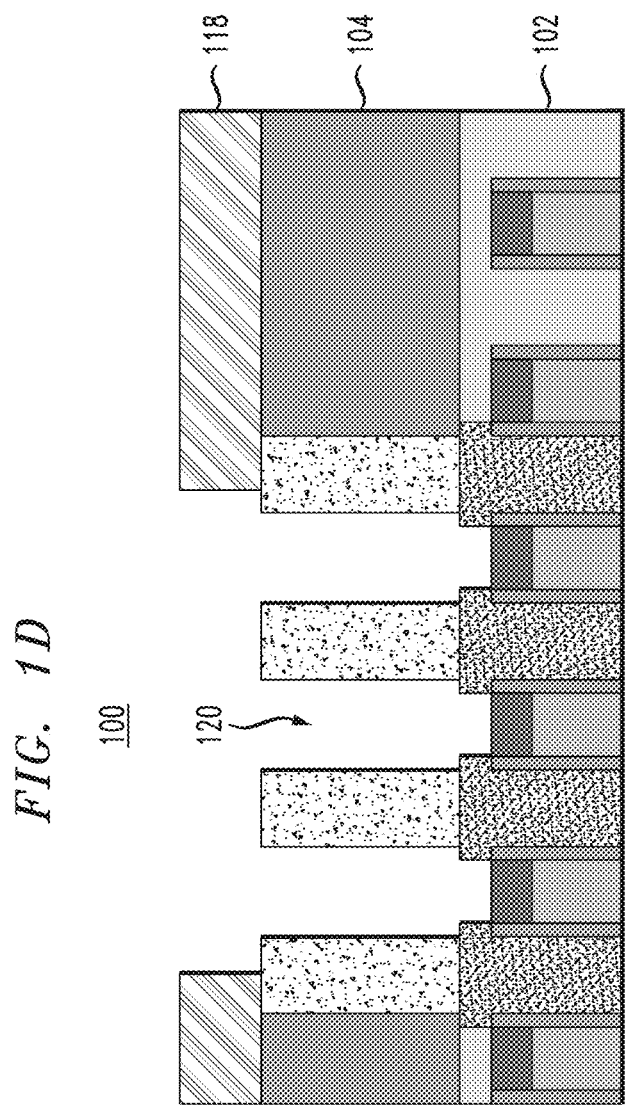
FIG. 1D is a schematic cross-sectional side view a portion of a semiconductor structure at a fourth-intermediate dual-damascene interconnect fabrication stage, according to an embodiment of the invention.

With reference to FIG. 1D, an exemplary step of removing dielectric from the ILD layer of structure 100 is shown. As shown, structure 100 includes ILD layers 102 and 104, etch mask 118 and dielectric openings 120. Dielectric openings 120 are formed in the area defined by etch mask 118 by an etching process to remove dielectric material within ILD layer 104. In one embodiment, the dielectric removal may be extended into the contact level of ILD layer 102. Etching processes for removing the dielectric material to form the openings in accordance with the embodiments described herein are known in the art, and a further discussion thereof will not be provided herein.

Figure 1E:
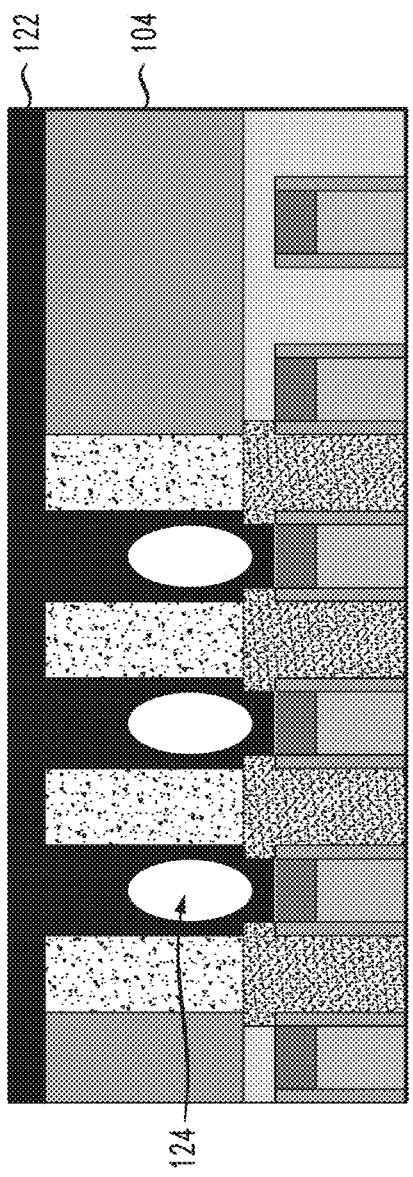
FIG. 1E is a schematic cross-sectional side view a portion of a semiconductor structure at a fifth-intermediate dual-damascene interconnect fabrication stage, according to an embodiment of the invention.

With reference to FIG. 1E, an exemplary step of forming air gaps within the ILD layer of structure 100 is shown. As shown, the etch mask 118 has been removed from the structure, and dielectric 122 is deposited to substantially fill the dielectric openings 120. Due to overfilling, dielectric 122 may additionally cover at least a portion of the top of ILD layer 104. In one embodiment, dielectric 122 is comprised of a low-k dielectric material.

As further shown in FIG. 1E, air gaps are formed within portions of the dielectric deposited in the openings that were formed during the etching process described in FIG. ID, such as air gap 124. Air gap 124 may be comprised of a gas from the ambient air, or may be comprised of an inert gas, e.g., nitrogen gas, helium, etc. In one embodiment, air gap 124 has a k value less than or equal to about 1.5.

For example, the air gaps shown in FIG. 1E, such as air gap 124, may be formed via a single-step dielectric deposition process or a two-step dielectric deposition process. In the single-step deposition process, an air gap is formed with a specific thickness and conformality associated with a single dielectric deposition. Thus, the single-step dielectric deposition process does not necessarily provide for adjusting the height of air gaps and controlling the shape and/or dimensions of the air gaps.

However, the two-step dielectric deposition process provides increased flexibility over the single-step deposition process with respect to height adjustment and shape and/or dimension control. The first step of the two-step dielectric deposition process is providing an ultrathin conformal dielectric deposition (e.g., a dielectric deposition having a thickness of about 1-10 nanometers (nm) and a conformality greater than or equal to about 70%) to form a protective sidewall layer. The second step of the two-step dielectric deposition process is providing a thicker non-conformal dielectric deposition (e.g., a dielectric deposition having a thickness of about 3-100 nm having a conformality less than or equal to about 40%) to pinch off the top surface to form the air gaps. The height of an air gap having a specific opening and aspect ratio is adjusted by varying the thickness and/or conformality of the dielectric deposition(s). Accordingly, the height of the air gaps may be adjusted by thickness and/or conformal modulation.

With reference to FIG. 1F, an exemplary step of removing the sacrificial material 116 from structure 100 is shown. As shown, the top layer of the dielectric material is removed, thereby leaving the portions of the dielectric deposited in the openings, such as dielectric 122 having embedded air gap 124. Processes for removing dielectric material in accordance with the embodiments described herein are known in the art. For example the top layer of the dielectric material may be removed by a chemical mechanical polishing (CMP) process, and then the remaining dielectric material may be selectively removed by an etching process (e.g., wet etching or dry (plasma) etching) to recess the remaining dielectric material to a specific height above the air gaps.

As further shown in FIG. 1F, the sacrificial material 116 is also removed, leaving via portions that include via portion 126. As mentioned above, the sacrificial material 116 may be comprised of an organic material or inorganic material. If the sacrificial material 116 is comprised of an organic material, a dry etch process, such as a reactive ion etching (RIE) process, may be utilized to remove the sacrificial material 116. If the sacrificial material 116 is comprised of an inorganic material (e.g., metallic), a wet etch process may be utilized to remove the sacrificial material 116. Processes for removing sacrificial material in accordance with the embodiments described herein are known in the art, and a further discussion thereof will not be provided herein.

Figure 1G:
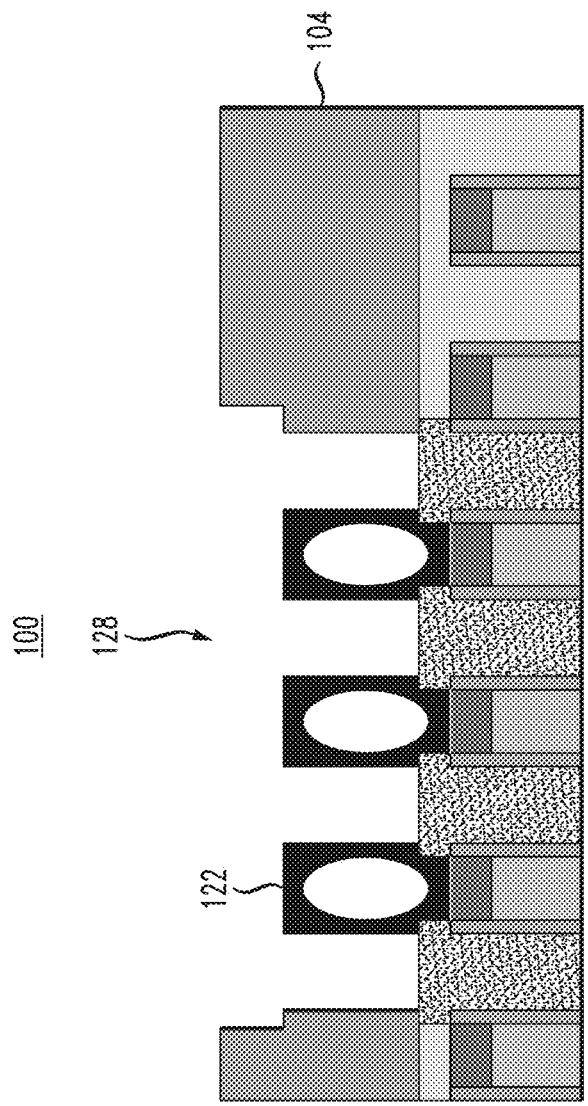
FIG. 1G is a schematic cross-sectional side view a portion of a semiconductor structure at a seventh-intermediate dual-damascene interconnect fabrication stage, according to an embodiment of the invention.

With reference to FIG. 1G, an exemplary metal patterning step performed on structure 100 is shown. Region 128 shown in FIG. 1G results from performing metal layer patterning along the upper layer of ILD 104. In one embodiment, the metal layer patterning comprises an etching of the upper surface of ILD layer 104 and upper portions of the dielectric material 122. The metal layer patterning allows for metal deposition to subsequently be performed to complete a MOL structure.

Figure 1H:
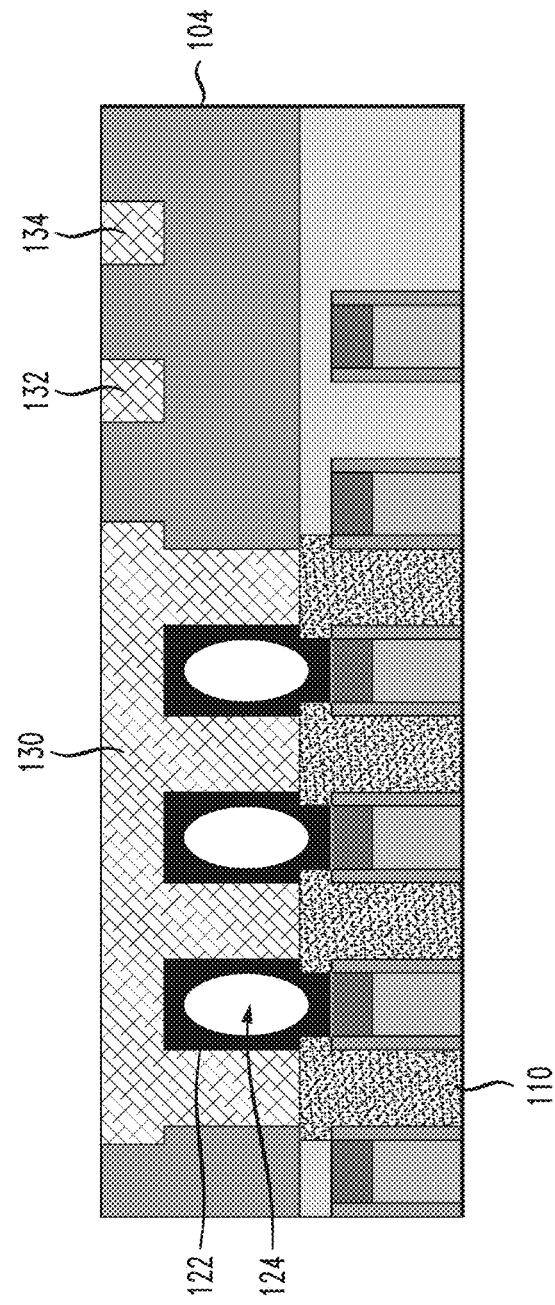
FIG. 1H is a schematic cross-sectional side view a portion of a semiconductor structure at an eighth-intermediate dual-damascene interconnect fabrication stage, according to an embodiment of the invention.

With reference to FIG. 1H, an exemplary step of metal deposition performed on structure 100 is shown. As shown, metal interconnect 130 is formed within region 128 that resulted from the etching process described above in FIG. 1G. In one embodiment, forming metal interconnect 130 comprises depositing Cu to substantially fill the region. In the illustrative embodiment, metal interconnect 130 is coupled to source/drain contact regions 110. Each section of interconnect 130 is separated from an adjacent section by portions of dielectric material 122 having embedded air gaps, such as air gap 124, resulting in a reduction in gate to source capacitance (CGS). Additional metal interconnects, such as interconnects 132 and 134, may be formed by depositing Cu within the upper surface of ILD layer 104. In one embodiment, the additional metal interconnects 132 and 134 are formed simultaneously with the formation of metal interconnect 130. However, the additional metal interconnects 132 and 132 may be formed subsequent to the formation of metal interconnect 130. After the metal is deposited, excess metal is removed from the surface of ILD layer 104. In one embodiment, a CMP process is utilized to remove the excess metal.

With reference to FIG. 1I, an exemplary step that may be performed on a completed MOL structure is shown. As shown, structure 100 includes metal interconnects 130, 132 and 134. A second air gap formation process is performed to form air gaps between interconnects 130, 132 and 134 to further reduce capacitance coupling (e.g., air gap 136). As discussed above with reference to FIG. 1E, the second air gap formation process may be a single-step deposition process or a two-step deposition process. In one embodiment, the second air gap formation process is performed after the deposition of the additional metal interconnects 132 and 134.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method for forming a semiconductor structure comprising steps of:
   forming an upper layer in a first interlayer dielectric (ILD) layer, wherein forming the upper layer in the first ILD layer comprises:
      forming a plurality of metal interconnects; and
      forming one or more upper layer air gaps positioned between adjacent metal interconnects;
   forming a lower layer in the first ILD layer, wherein forming the lower layer in the first layer comprises
      forming one or more lower layer air gaps positioned between adjacent vias formed within the lower layer;
   forming a second ILD layer prior to forming the first ILD layer;
   embedding one or more components in the second ILD layer, wherein the one or more components comprise:
   one or more gate regions,
   one or more caps,
   one or more source/drain contact regions, and
   one or more barrier lines,
   wherein each cap is positioned in physical contact with a respective gate region.

2. The method of claim 1, wherein a given one of the one or more lower layer air gaps is comprised of ambient air.

3. The method of claim 1, wherein a given one of the one or more lower layer air gaps is comprised of an inert gas.

4. The method of claim 3, wherein the inert gas comprises one of nitrogen and helium.

5. The method of claim 1, wherein the one or more lower layer air gaps are formed within one or more respective dielectric regions.

6. The method of claim 5, wherein the one or more dielectric regions are comprised of a low-k dielectric material.

7. The method of claim 1, wherein the second ILD layer is formed via one of chemical vapor deposition, atomic layer deposition, plasma enhanced chemical vapor deposition, and spin coating.

8. The method of claim 7, wherein the one or more components comprise one or more contacts.

9. The method of claim 1, wherein the second ILD layer is comprised of a low-k dielectric material.

10. The method of claim 1, wherein the one or more lower layer air gaps are formed within one or more respective dielectric regions, and wherein the one or more dielectric regions are positioned in physical contact with the one or more caps, respectively.

11. A method for forming a semiconductor structure comprising steps of:
   forming an upper layer in a first interlayer dielectric (ILD) layer, wherein forming the upper layer in the first layer comprises:
      forming a plurality of metal interconnects; and
      forming one or more upper layer air gaps positioned between adjacent metal interconnects; and
   forming a lower layer in the first ILD layer, wherein forming the lower layer in the first ILD layer comprises
      forming one or more lower layer air gaps positioned between adjacent vias formed within the lower layer;
      forming a second ILD layer prior to forming the first ILD layer;
      embedding one or more components in the second ILD layer, wherein the one or more components comprise:
      one or more gate regions,
      one or more caps, and
      one or more barrier lines,
      wherein each cap is positioned in physical contact with a respective gate region.

12. The method of claim 11, wherein a given one of the one or more lower layer air gaps is comprised of ambient air.

13. The method of claim 11, wherein a given one of the one or more lower layer air gaps is comprised of an inert gas.

14. The method of claim 13, wherein the inert gas comprises one of nitrogen and helium.

15. The method of claim 11, wherein the one or more lower layer air gaps are formed within one or more respective dielectric regions.

16. A method for forming a semiconductor structure comprising steps of:
   forming an upper layer in a first interlayer dielectric (ILD) layer, wherein forming the upper layer in the first ILD layer comprises:
      forming a plurality of metal interconnects; and
      forming one or more upper layer air gaps positioned between adjacent metal interconnects; and
   forming a lower layer in the first ILD layer, wherein forming the lower layer in the first ILD layer comprises
      forming one or more lower layer air gaps positioned between adjacent vias formed within the lower layer,
      wherein the second ILD layer is formed via one of chemical vapor deposition, atomic layer deposition, plasma enhanced chemical vapor deposition, and spin coating;

forming a second ILD layer prior to forming the first MD layer;

embedding one or more components in the second ILD layer, wherein the one or more components comprise:

one or more gate regions, one or more caps, one or more source/drain contact regions and one or more barrier lines, wherein each cap is positioned in physical contact with a respective gate region.

17. The method of claim 16, wherein a given one of the one or more lower layer air gaps is comprised of ambient air.

18. The method of claim 16, wherein a given one of the one or more lower layer air gaps is comprised of an inert gas.

19. The method of claim 18, wherein the inert gas comprises one of nitrogen and helium.

20. The method of claim 16, wherein the one or more lower layer air gaps are formed within one or more respective dielectric regions.

\* \* \* \* \*